United States Patent [19]
Shishikura et al.

[11] Patent Number: 5,644,259
[45] Date of Patent: Jul. 1, 1997

[54] RESET CIRCUIT AND INTEGRATED CIRCUIT INCLUDING THE SAME

[75] Inventors: Nobuo Shishikura, Yokohama; Makiko Ogiu, Shinjuku-Ku, both of Japan

[73] Assignee: Kabushiki Kaisha Toshiba, Kawasaki, Japan

[21] Appl. No.: 620,751

[22] Filed: Mar. 18, 1996

Related U.S. Application Data

[63] Continuation of Ser. No. 118,202, Sep. 9, 1993, abandoned.

[30] Foreign Application Priority Data

Sep. 11, 1992 [JP] Japan ............... 4-243750

[51] Int. Cl.$^6$ ............... H03L 7/00; H03K 3/02
[52] U.S. Cl. ............... 327/143; 327/185
[58] Field of Search ............... 307/272.3, 269, 307/272.1, 296.1, 303; 327/142, 143, 185, 564, 565

[56] References Cited

U.S. PATENT DOCUMENTS

| | | | |
|---|---|---|---|
| 5,203,000 | 4/1993 | Folkes | 395/750 |
| 5,268,765 | 12/1993 | Yamashita | 250/208.1 |
| 5,309,037 | 5/1994 | Curley | 307/272.3 |
| 5,446,403 | 8/1995 | Witkowski | 327/143 |

FOREIGN PATENT DOCUMENTS 4145835  5/1992  Japan ............... 307/272.3

*Primary Examiner*—William L. Sikes
*Assistant Examiner*—Tiep H. Nguyen
*Attorney, Agent, or Firm*—Foley & Lardner

[57] ABSTRACT

A reset circuit includes a plurality of registers (R1–R8) in which a logical value at power on is shifted and set to a predetermined logical value after a predetermined time has elapsed since a power supply was switched on and a logic circuit (1) for outputting a coincidence signal while each of the plurality of registers is set to the predetermined logic value but outputting a non-coincidence signal while when at least one register is set to a value different from the predetermined logical value. The non-coincidence signal is employed as a reset signal. The plurality of registers are designed to output a value different from the predetermined logic value initially when switching on the power supply. The reset signal can be obtained by even a low power voltage irrespective of a power voltage waveform at the power-on time.

4 Claims, 5 Drawing Sheets

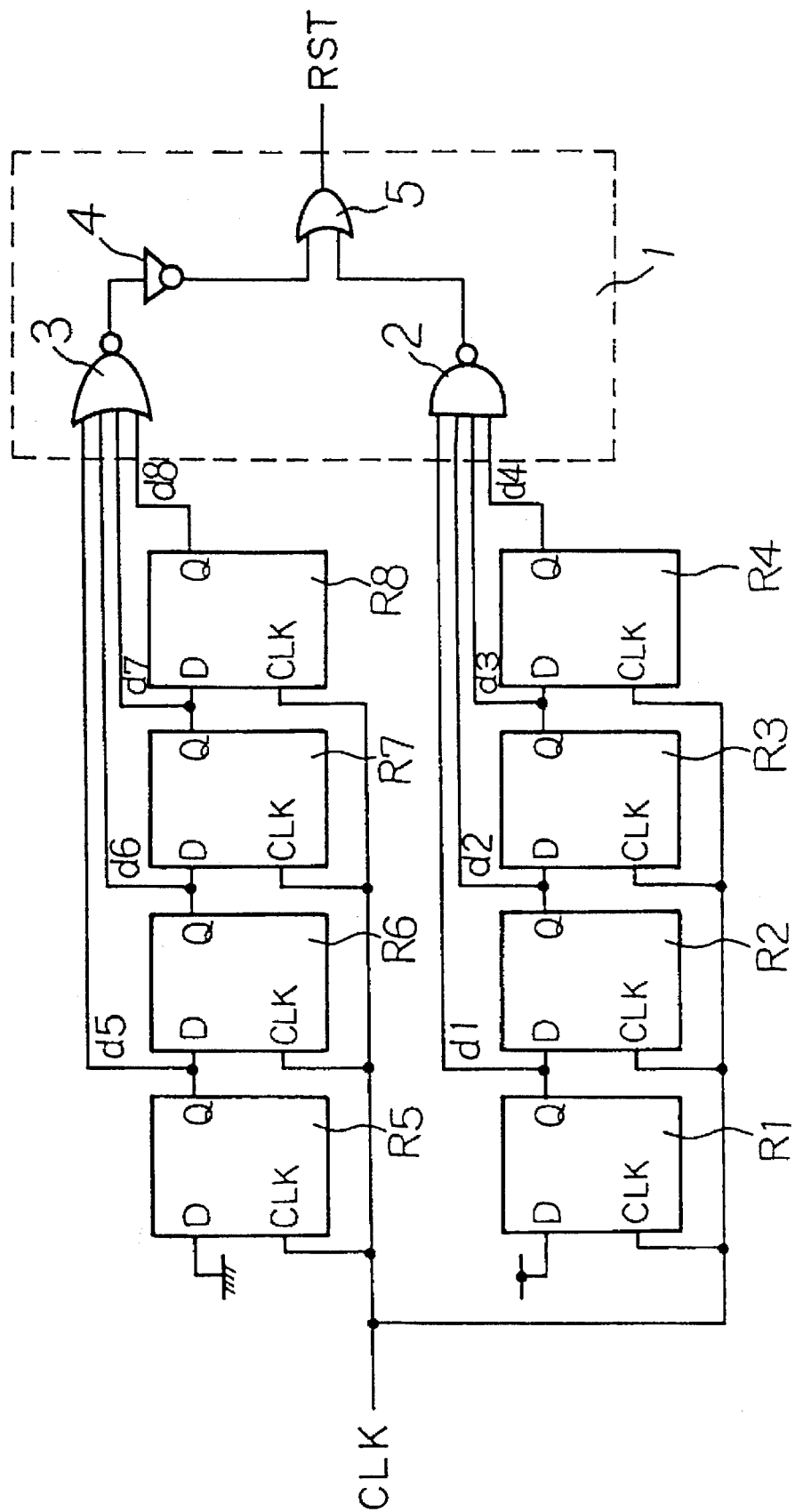
F I G. 1

RESET CIRCUIT AND INTEGRATED CIRCUIT INCLUDING THE SAME

This application is a continuation of application Ser. No. 08/118,202, filed Sep. 9, 1993, now abandoned.

BACKGROUND OF THE INVENTION

1. Field of the Invention

The present invention relates generally to a reset circuit and, more particularly, to a reset circuit used for resetting when switching on a power supply of an integrated circuit integrated on a semiconductor substrate. The present invention also relates to an integrated circuit including this reset circuit.

2. Description of the Prior Art

A conventional resetting practice when turning on a power supply of an integrated circuit formed on a semiconductor substrate is to provide a reset circuit for generating a reset signal at the power-on, externally or internally of the integrated circuit and to conduct resetting operation necessary at power-on.

FIGS. 5 and 6 are block diagrams each showing one example of the conventional reset circuit. In the circuit illustrated in FIG. 5, a reset circuit 20 is constructed by series-connecting a capacitor C and a resistor R to which a diode is connected in parallel. An output terminal of the reset circuit 20 is connected to a reset terminal of an integrated circuit 10 and a reset signal generated at the power-on is applied thereto.

Further, in a circuit shown in FIG. 6, a reset circuit 20a is constructed of a constant voltage power circuit. An output signal VOUT thereof is supplied to the reset terminal of the integrated circuit 10.

The conventional reset circuits, however, have a limit in terms of capability to generate the reset signal at the power-on time, depending on a magnitude of a power voltage employed by the integrated circuit receiving the reset signal and conditions such as a slope of rise of the power voltage at the power-on and so forth. For example, in the C-R reset circuit illustrated in FIG. 5, the slope of rise of the power voltage at the power-on is restricted due to the circuit characteristics. Therefore, there has been a problem in that the circuit can not be used in the case of the slope being smaller than a certain level.

Furthermore, a reset circuit for generating the reset signal by use of the constant voltage power circuit shown in FIG. 6 presents a problem that there exists a limit in terms of a magnitude of the power voltage used by the integrated circuit receiving the reset signal because of the circuit characteristics. Accordingly, the circuit can not be used in the case of a power voltage being smaller than a certain level.

SUMMARY OF THE INVENTION

It is a primary object of the present invention, which has been devised to obviate the problems mentioned above, to provide a reset circuit capable of outputting a reset signal even by a low power voltage without being restricted to a waveform of the power voltage at power-on.

It is another object of the present invention to provide an integrated circuit which can reset circuits included therein without having restrictions.

A reset circuit according to the present invention is constructed of a plurality of registers set to a predetermined logic value after a predetermined time has elapsed since a power supply was switched on. The registers are, however, designed according to process or circuit design conditions so that the logic values of the registers are set to a value different from the predetermined logic value at the power-on. Then, the reset signal is given as an output of a logic circuit for establishing a combination of the logic values of the plurality of registers.

This logic circuit is constructed to output a coincidence signal when the plurality of registers are set to the predetermined logic value but output a non-coincidence signal when even one register is set to a value different from the predetermined logic value. Accordingly, at least one of the plurality of registers is set to a value different from the predetermined value at the power-on time. The logic circuit therefore outputs the non-coincidence signal. It follows that this non-coincidence signal is outputted as a reset signal.

The integrated circuit according to the present invention includes the above-mentioned reset circuit and other circuits which are controlled by reset signals generated by the reset circuit.

BRIEF DESCRIPTION OF THE DRAWINGS

Other objects and advantages of the present invention will become apparent during the following discussion in conjunction with the accompanying drawings, in which:

FIG. 1 is a circuit diagram showing one embodiment of a reset circuit according to the present invention;

DESCRIPTION OF THE PREFERRED EMBODIMENTS

Figure 2:
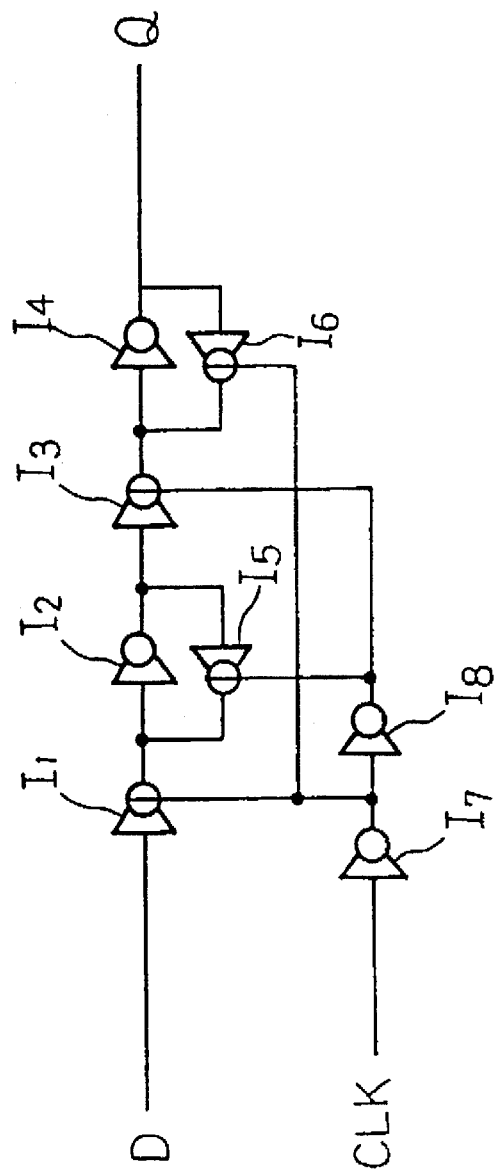
FIG. 2 a circuit diagram fully showing a register employed in the circuit of FIG. 1.

Embodiments of the present invention will hereinafter be described in detail.

FIG. 1 is a circuit diagram illustrating a reset circuit in one embodiment of the present invention. This reset circuit is constructed of a plurality of registers and a logic circuit for outputting a coincidence or non-coincidence signal on the basis of a combination of logic values of these registers. The explanation in the embodiment shown in FIG. 1 is, however, centered on 8-bit registers. Note that the number of the registers is not limited to 8 bits but may preferably be as large as possible to accomplish the object of the present invention.

Referring to FIG. 1, the symbols R1–R8 represent registers. Outputs d1–d8 of the registers R1–R8 are given to the logic circuit 1. The logic circuit 1 outputs a reset signal RST according to contents of the logic values of the registers. Herein, the registers R1–R4 are designed circuitwise or processwise so that logic values are readily set to "0" when switching on the power supply. The registers R5–R8 are also designed likewise so that the logic values are readily set to "1" when switching on the power supply.

More specifically, for this purpose, conditions of ion implantation are slightly varied so that VTH is set differently at high and low levels within an allowable limit with respect to a transistor comprising the registers R1–R4 and a transistor comprising the registers R5–R8.

Outputs d1–d4 of the registers R1–R4 are each connected to an input of a NAND circuit 2. Outputs d5–d8 of the registers R5–R8 are each connected to an input of NOR circuit 3. Then, an output of the NAND circuit 2 is inputted to one input of an OR circuit 5. An output of the NOR circuit 3 is also connected via an inverter 4 to the other input of the OR circuit 5. An output from the OR circuit 5 turns out a reset signal RST.

FIG. 2 is a circuit diagram showing detailed circuitry of each of the register R1–R8. Illustrated data input terminal D, clock input terminal CLK and output terminal Q respectively correspond to the same symbols shown in FIG. 1.

Connected in series between a D-output and a Q-output in this circuit are an inverter I1, inverters I2 and I5 connected in circulation, an inverter I3 and inverters I4, I6 connected in circulation. The inverters I1, I3, I5, I6 among these inverters are conceived as clocked inverters. Then, two-stage inverters I7, I8 are connected in series to the clock signal CLK is supplied to the inverter I7. An output of the inverter I7 is imparted to the inverters I1, I6. An output of the inverter I8 is imparted to the inverters I3, I5.

Given herein are conditions under which the reset signal RST defined as an output of the OR circuit 5 is not outputted in the circuit shown in FIG. 1, i.e., the logical value "0" is outputted. The conditions are such that the outputs d1–d4 of the registers R1–R4 are all set to "1", and the outputs d5–d8 of the registers R5–R8 are all set to "0" As described above, the registers R1–R4 are designed so that the logic values are readily set to "0" at the power-on. The registers R5–R8 are also designed likewise so that the logical values are readily set to "1" A probability that the reset signal RST is not outputted is, as explained above, very small.

In the embodiment shown in FIG. 1, the four registers R1–R4 are combined to constitute a first shift register. The registers R8–R8 constitute a second shift register. These two shift registers employ the clock signals CLK as clocks for shifting. In this case, the clock signal CLK may involve the use of a clock used for the normal operation of an integrated circuit actuated by this reset circuit but is not limited to this clock.

Next, the operation of the reset circuit at the power-on time will be explained. When switching on the power supply, the registers R1–R4 are initially set to "0", while the registers R5–R8 are also set to "1". In this status, the reset signal RST is outputted from the OR circuit 5. Even if seven pieces of registers at the maximum among the eight registers R1–R8 are set to a logic value reverse to the initial set value given above at the power-on time, the reset signal RST is to be outputted from the OR circuit 5. Namely, if at least one register is set to the expected value described above at the power-on time, it follows that the reset signal RST is outputted.

The integrated circuit actuated by the reset signal RST outputted from this OR circuit 5 is initialized, i.e., reset. Subsequently, there acts the clock signal CLK employed for the normal operation of the integrated circuit actuated by the reset circuit, data in the first shift register consisting of the registers R1–R4 and the second shift register consisting of the registers R8–R8 are shifted. With four clocks, the logical values of the registers R1–R4 are all set to "1", while the logical values of the registers R5–R8 are all set to "0". Hereat, the reset signal RST of the OR circuit, etc. is canceled. Videlicet, the logic values become "0", whereby the integrated circuit is allowed to operate normally.

Though the two shift registers are constructed of the registers readily set to "0" and the registers readily set to "1" at the power-on, and the reset signal RST is outputted by the logic circuit 1 in the embodiment shown in FIG. 1, the shift registers are not necessarily constructed in this manner. For instance, only the first shift register constructed by registers R1–R4 readily set to "0" at the power-on or only the second shift register constructed registers R5–R8 readily set to "1" at the power-on is employed to construct the reset circuit according to the present invention.

Incidentally, as in the embodiment of FIG. 1, the reset circuit includes the registers readily set to "0" as well as including the registers readily set to "1". With this arrangement, even when exhibiting such a tendency that this characteristic is readily set to "0" or "1" due to a distribution in terms of manufacturing process or the like, there increases a possibility that any of the registers readily set to "0" or of the registers readily set to "1" is set to the expected value thereof. The reset circuit of this invention can therefore be certainly constructed.

Figure 3:
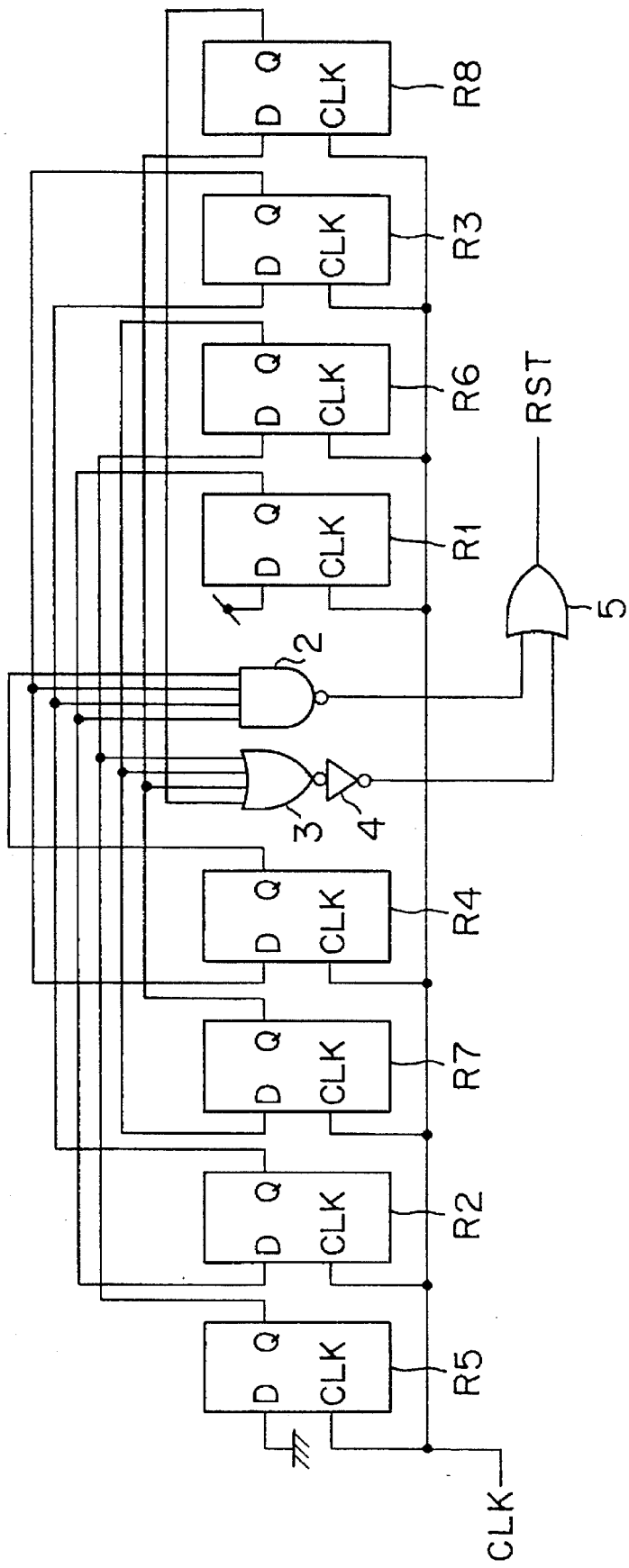
FIG. 3 is a circuit diagram showing another embodiment of the present invention.

FIG. 3 shows an another embodiment of the present invention. This figure shows not only connections but also arrangement of registers in an actual integrated circuit.

In this embodiment, though circuit connections are identical to the embodiment shown in FIG. 1, registers (R5, R7, R6 and R8) readily set to "1" at the power on and registers (R2, R4, R1 and R3) readily set to "0" at the power on are disposed alternately. Since such arrangement reduces positional effect of distribution due to the manufacturing process, any one of the registers can have different logical values without fail from the predetermined value.

As described above in greater detail based on the embodiments, it is possible to construct the reset circuit capable of generating the reset signal without being limited to a waveform of the power voltage at the power-on according to this invention. Hence, the reset signal can be supplied even when the operating power voltage of the integrated 20 circuit is low.

Figure 4:
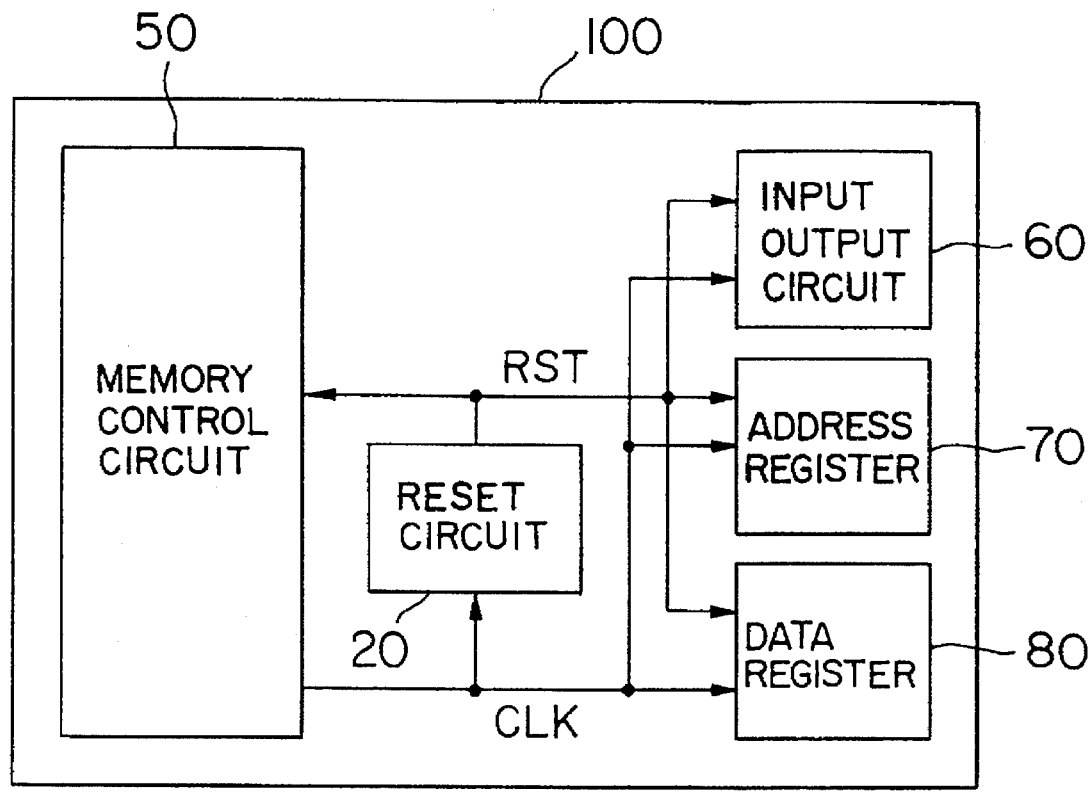
FIG. 4 is a schematic diagram showing an integrated circuit according to the present invention.
Figure 5:
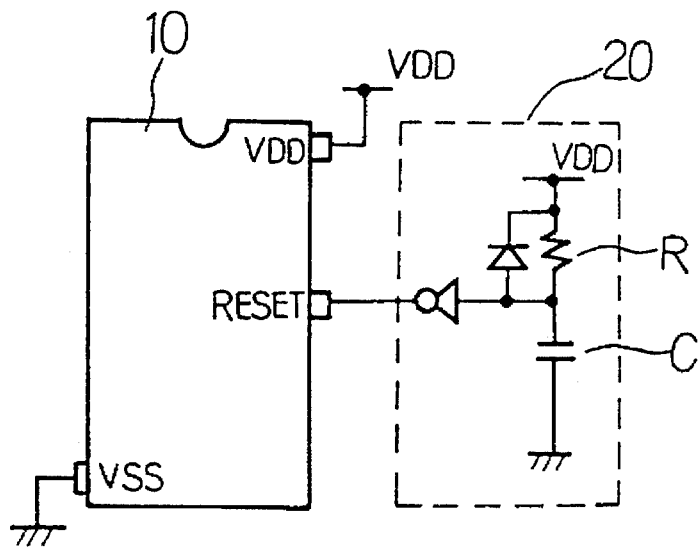
FIG. 5 is a circuit diagram showing one example of a conventional reset circuit.
Figure 6:
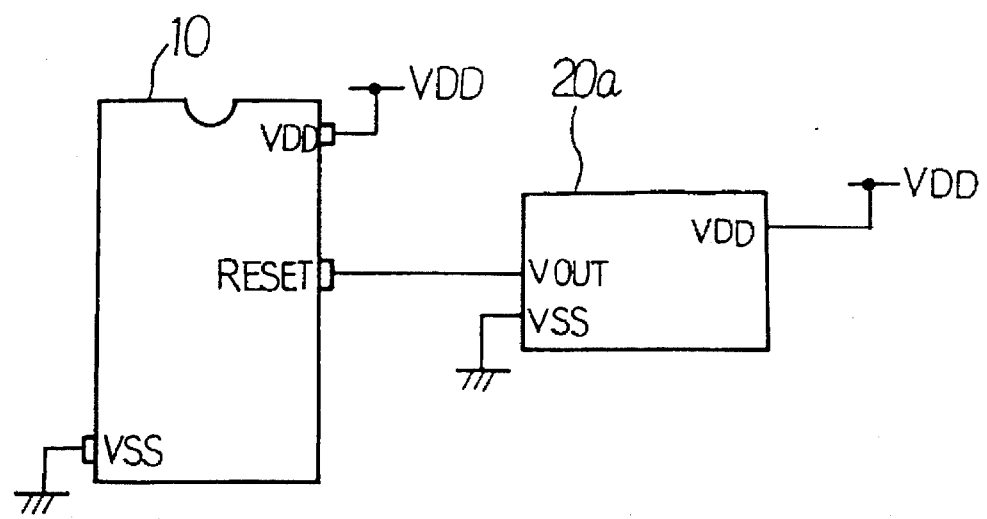
FIG. 6 is a circuit diagram showing one example of another conventional reset circuit.

FIG. 4 shows a schematic diagram of an integrated circuit 100 according to the present invention. This integrated circuit 100 is a memory circuit as an example. A reset circuit 20 according to the present invention and a memory control circuit 50, input-output circuit 60, an address register 70 and a data register 80, which are controlled by the reset signals supplied by the reset circuit 20, are formed on the same substrate.

In this embodiment, a clock signal for the circuits can be commonly used as the clock signal for the reset circuit. Therefore the terminal for an exclusive use of externally inputting the reset signal is not therefore required.

It is apparent that, in this invention, a wide range of different working modes can be formed based on the invention without deviating from the spirit and scope of the invention. This invention is not restricted by its specific working modes except being limited by the appended claims.

What is claimed is:

1. A reset circuit comprising:

a first shift register including a first register group having a first number of registers connected in series, each of said first number of registers being readily set to logical "0" at power on, and a second shift register including a second register group having a second number of registers, each of said second number of registers being readily set to logical "1" at power on; and a logic circuit for outputting a coincidence signal when each of said registers of said first and second register groups is respectively set to a corresponding predetermined logical value and for outputting a non-coincidence signal when at least one register of said first and second register groups is set to a logical value different from a corresponding predetermined logical value, wherein said non-coincidence signal is used as a reset signal and the first number of registers readily set to logical "0" and the second number of registers readily set to logical "1" are alternately disposed on a semiconductor substrate.

2. A reset circuit comprising:

a plurality of registers which are set to respective predetermined logical values after a predetermined time has elapsed since a power supply was switched on; and a logic circuit for outputting a coincidence signal when said plurality of registers are set to the respective predetermined logical values and for outputting a non-coincidence signal which is used as a reset signal when at least one register of said plurality of registers is set to a logical value different from its respective predetermined logical value, wherein said at least one register has a value at power on depending on a manufacturing process or circuit design conditions, wherein a first number of said plurality of registers are connected in series to thereby constitute a first shift register, and, when a clock signal is inputted to said first shift register a predetermined number of times, logical values of the first shift register become said respective predetermined logical values, each of said first number of said plurality of registers being readily set to logical "0" at power on, and wherein a second number of said plurality of registers are connected in series to thereby constitute a second shift register, each of said second number of said plurality of registers being readily set to logical "1" at power on.

3. The reset circuit according to claim 2, wherein said first number of registers readily set to logical "0" and said second number of registers readily set to logical "1" are alternately disposed on a semiconductor substrate.

4. An integrated circuit comprising:

a reset circuit having a plurality of registers which are set to respective predetermined logical values after a predetermined time has elapsed since a power supply was switched on; and a logic circuit for outputting a coincidence signal when said plurality of registers are set to the respective predetermined logical values and for outputting a non-coincidence signal when at least one register of said plurality of registers is set to a logical value different from its respective predetermined logical value, wherein said non-coincidence signal is used as a reset signal; and a circuit controlled by said reset signal;

wherein said reset circuit and said circuit controlled are integrated on the same semiconductor substrate, wherein a first number of said plurality of registers are connected in series to thereby constitute a first shift register, and, when a clock signal is inputted to said first shift register a predetermined number of times, logical values of said first shift register become said respective predetermined logical values, each of the first number of said plurality of registers being readily set to logical "0" at power on, wherein a second number of said plurality of registers are connected in series to thereby constitute a second shift register, each of the second number of said plurality of registers being readily set to logical "1" at power on, and wherein said first number of said plurality of registers and said second number of said plurality of registers are alternately disposed on said semiconductor substrate.

* * * * *